US012794425B2

(12) United States Patent
Lai

(10) Patent No.: US 12,794,425 B2
(45) Date of Patent: Nov. 10, 2026

(54) RF POWER AMPLIFIER AND DIFFERENTIAL INDUCTOR CIRCUIT THEREOF

(71) Applicant: REALTEK SEMICONDUCTOR CORPORATION, Hsinchu (TW)

(72) Inventor: Chih-Wei Lai, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 309 days.

(21) Appl. No.: 18/648,520

(22) Filed: Apr. 29, 2024

(65) Prior Publication Data

US 2024/0372515 A1 Nov. 7, 2024

(30) Foreign Application Priority Data

May 2, 2023 (TW) ................................ 112116264

(51) Int. Cl.
*H03F 3/24* (2006.01)
*H03F 3/00* (2006.01)

(52) U.S. Cl.
CPC ............. *H03F 3/245* (2013.01); *H03F 3/005* (2013.01); *H03F 2200/451* (2013.01)

(58) Field of Classification Search
CPC ......... H03F 2200/451; H03F 2200/537; H03F 2203/45731; H03F 3/005; H03F 3/195; H03F 3/217; H03F 3/245; H03F 3/45071
See application file for complete search history.

(56) References Cited

U.S. PATENT DOCUMENTS

2003/0030532 A1* 2/2003 Iida ..................... H01F 17/0006 336/200
2003/0202331 A1* 10/2003 Jessie .................... H10W 20/40 361/764

(Continued)

FOREIGN PATENT DOCUMENTS

TW I742935 B 10/2021

OTHER PUBLICATIONS

Sang-Min Yoo et al., 2011_JSSC_A Switched-Capacitor RF Power Amplifier, Dec. 2011, IEEE Journal of Solid-State Circuits, vol. 46, No. 12.

(Continued)

*Primary Examiner* — Kashif Siddiqui
(74) *Attorney, Agent, or Firm* — WPAT, PC

(57) ABSTRACT

The present disclosure discloses a differential inductor circuit is provided that includes a first coil inductor and a second coil inductor. The first coil inductor is coupled to a first terminal and starts to extend for a first half circle and further extend to surround an central area for N first full circles to be coupled to a second terminal, wherein N is an integer larger than or equal to 0. The second coil inductor is coupled to a third terminal to and starts to extend for a second half circle and further extend to surround the central area for N second full circles to be coupled to a fourth terminal, in which the second half circle and the first half circuit together enclose the central area. The first coil inductor receives a first signal of a pair of differential signals to generate a first current and the second coil inductor receives a second signal of the pair of differential signals to generate a second current, in which the first current and the second current have directions inverse to each other.

11 Claims, 2 Drawing Sheets

(56) References Cited

U.S. PATENT DOCUMENTS

| | | | | |
|---|---|---|---|---|
| 2019/0097583 A1* | 3/2019 | Chamas | .............. | H03F 3/45242 |
| 2020/0035395 A1* | 1/2020 | Maxim | ............... | H01F 17/0013 |
| 2021/0194444 A1* | 6/2021 | Kondo | .................... | H03F 1/565 |
| 2022/0158343 A1* | 5/2022 | Hassan | .................. | H01Q 3/247 |

OTHER PUBLICATIONS

Ao Ba et al., 2016_ISSCC_A 1.3nJb IEEE 802.11ah fully digital polar transmitter for IoE applications, 2016 IEEE International Solid-State Circuits Conference.

Voravit Vorapipat et al., 2017_JSSC_A Class-G Voltage-Mode Doherty Power Amplifier, Dec. 2017, IEEE Journal of Solid-State Circuits, vol. 52, No. 12.

OA letter of a counterpart TW application (appl. No. 112116264) mailed on Mar. 11, 2024. Summary of the TW OA letter: 1. Claims 6 and 8 include editorial errors. 2. Fig. 1 includes an editorial error. 3. Claims 1, 5, 6, 8 and 10 are rejected as allegedly being unpatentable in view of cited reference 1 (TW I742935 B). 4. Claims 2-4, 7 and 9 are allowable. Correspondence bewteen claims of TW counterpart application and claims of US application: 1. Claims 1, 2-3, . . . , and 10 in TW counterpart application correspond to claims 1, 2-3, . . . 8 and 10-12 in US application, respectively.

* cited by examiner

RF POWER AMPLIFIER AND DIFFERENTIAL INDUCTOR CIRCUIT THEREOF

BACKGROUND OF THE INVENTION

1. Field of the Invention

The present disclosure relates to an RF power amplifier and a differential inductor circuit thereof.

2. Description of Related Art

An RF power amplifier is an important component of a transmitting terminal of an RF chip module. The main function of the RF power amplifier is to provide output power and efficiency such that an output power of a signal meets the system requirement. The signal can be transmitted by an antenna subsequently.

In the RF power amplifier that includes a switched-capacitor array, a differential inductor circuit that resonates with the switched-capacitor array is required to be disposed. However, two coils in the differential inductor circuit are typically disposed independently and distanced to each other such that a larger area is occupied. The windings of the coils are symmetrical to each other such that the inductances thereof are decreased due to the mutual inductance therebetween. If larger inductances are desired, the area of the coils needs to be increased, which is not beneficial to electronic apparatuses with shrinking size.

SUMMARY OF THE INVENTION

In consideration of the problem of the prior art, an object of the present disclosure is to provide an RF power amplifier and a differential inductor circuit thereof.

The present invention discloses a differential inductor circuit that includes a first coil inductor and a second coil inductor. The first coil inductor is electrically coupled to a first terminal, starts to extend for a first half circle and further extends to surround an internal central area for N first full circles so as to be electrically coupled to a second terminal, wherein N is an integer larger than or equal to 0. The second coil inductor is electrically coupled to a third terminal, starts to extend for a second half circle and further extends to surround the internal central area for N second full circles so as to be electrically coupled to a fourth terminal, in which the second half circle and the first half circuit together enclose the central area. The first coil inductor receives a first signal of a pair of differential signals to generate a first current, and the second coil inductor receives a second signal of the pair of differential signals to generate a second current, and the first current and the second current have directions inverse to each other.

The present invention also discloses an RF power amplifier that includes a switched-capacitor array and a differential inductor circuit. The differential inductor circuit is electrically coupled between the switched-capacitor array and an antenna to transmit a pair of differential signals and includes a first coil inductor and a second coil inductor. The first coil inductor is electrically coupled to a first terminal, starts to extend for a first half circle and further extends to surround an internal central area for N first full circles so as to be electrically coupled to a second terminal, wherein N is an integer larger than or equal to 0. The second coil inductor is electrically coupled to a third terminal, starts to extend for a second half circle and further extends to surround the internal central area for N second full circles so as to be electrically coupled to a fourth terminal, in which the second half circle and the first half circuit together enclose the central area. The first coil inductor receives a first signal of the pair of differential signals to generate a first current, and the second coil inductor receives a second signal of the pair of differential signals to generate a second current, and the first current and the second current have directions inverse to each other.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an RF power amplifier and a differential inductor circuit thereof to allow the first coil inductor and the second coil inductor in the differential inductor circuit to share a central area. Not only the area of the two inductor circuits greatly reduces to roughly the size of a single inductor circuit, but also the inductances thereof are enhanced due to the mutual inductance of the two inductors. As a result, the objects of shrinking the area and increasing the inductance of the RF power amplifier can be accomplished at the same time.

Figure 1:
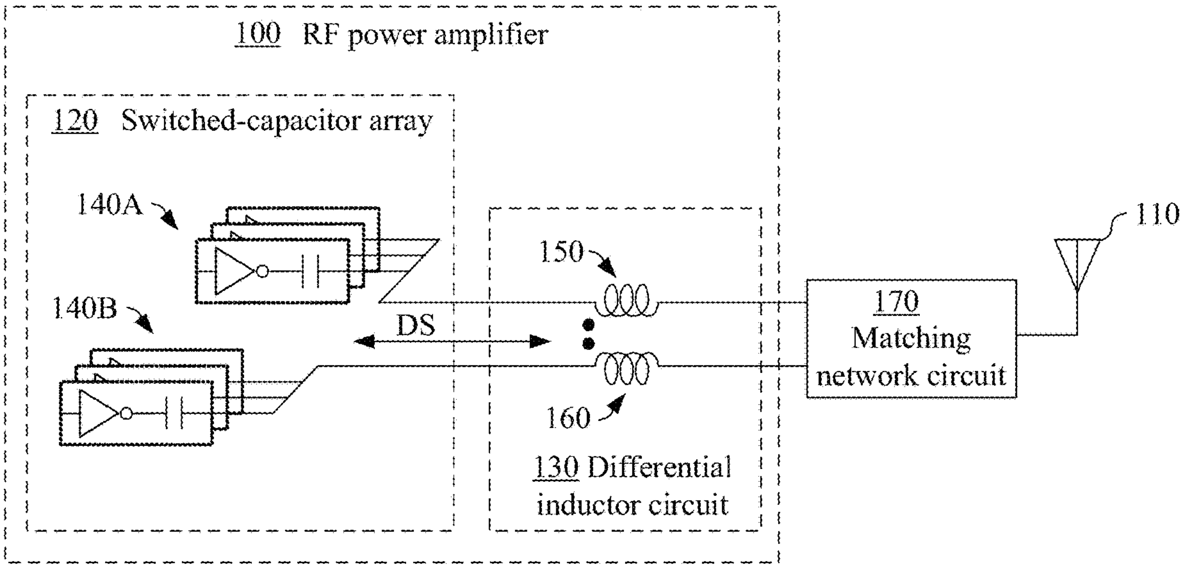
FIG. 1 illustrates a circuit diagram of an RF power amplifier and an antenna according to an embodiment of the present invention.

Reference is now made to FIG. 1. FIG. 1 illustrates a circuit diagram of an RF power amplifier 100 and an antenna 110 according to an embodiment of the present invention. The RF power amplifier 100 is configured to perform power amplification on an RF signal and transmit the amplified RF signal to the antenna 110 so as to be further transmitted to a wireless network.

The RF power amplifier 100 includes a switched-capacitor array 120 and a differential inductor circuit 130.

The switched-capacitor array 120 may include a first switched-capacitor array 140A and a second switched-capacitor array 140B each including components such as, but not limited to inverters and capacitors (not illustrated in the figure). In an embodiment, the switched-capacitor array 120 may be electrically coupled to other back end circuits (not illustrated in the figure) to perform signal transmission.

The differential inductor circuit 130 is electrically coupled between the switched-capacitor array 120 and the antenna 110 to transmit a pair of differential signals DS. The differential inductor circuit 130 includes a first coil inductor 150 and a second coil inductor 160.

In an embodiment, the first coil inductor 150 is correspondingly electrically coupled to the first switched-capacitor array 140A. The second coil inductor 160 is correspondingly electrically coupled to the second switched-capacitor array 140B. Selectively, the first coil inductor 150 and the second coil inductor 160 may be electrically coupled to the antenna 110 through a matching network circuit 170, in which the matching network circuit 170 may include different impedance components depending on practical requirements.

According to the connection relation described above, the first coil inductor 150 and the second coil inductor 160 can transmit the differential signals DS between the switched-capacitor array 120 and the antenna 110.

Figure 2:
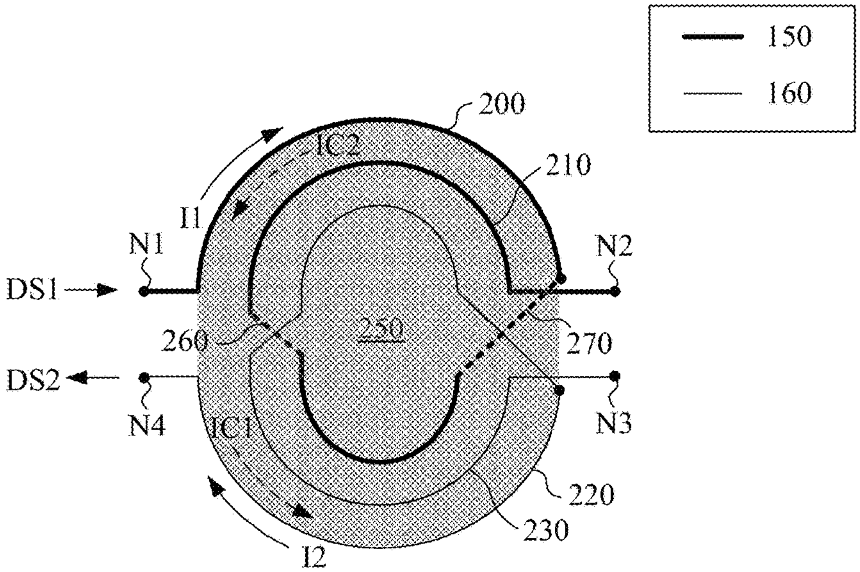
FIG. 2 illustrates a more detailed circuit diagram of the differential inductor circuit according to an embodiment of the present invention.

Reference is now made to FIG. 2. FIG. 2 illustrates a more detailed circuit diagram of the differential inductor circuit 130 according to an embodiment of the present invention.

The first coil inductor 150 is illustrated by a thicker line. The first coil inductor 150 is electrically coupled to the first terminal N1, starts to extend for a first half circle 200 and further extends to surround an internal central area 250 illustrated by a dark region in FIG. 1 for N first full circle 210 so as to be electrically coupled to a second terminal N2, wherein N is an integer larger than or equal to 0. In the present embodiment, N is 1.

The second coil inductor 160 is illustrated by a thinner line. The second coil inductor 160 is electrically coupled to a third terminal N3, starts to extend for a second half circle 220 and further extends to surround the internal central area 250 for N second full circle 230 so as to be electrically coupled to a fourth terminal N4, in which the second half circle 220 and the first half circle 200 together enclose the internal central area 250.

The first coil inductor 150 receives a first signal DS1 of the differential signals DS to generate a first current I1. The second coil inductor 160 receives a second signal DS2 of the differential signals DS to generate a second current I2, and the first current I1 and the second current I2 have directions inverse to each other.

According to the configurations and the current directions described above, a first induction current IC1 is generated at the second coil inductor 160 according to the first current I1 flowing through the first coil inductor 150. A second induction current IC2 is generated at the first coil inductor 150 according to the second current I2 flowing through the second coil inductor 160. The first induction current IC1 and the second current I2 have directions inverse to each other, and the second induction current IC2 and the first current I1 have directions inverse to each other such that inductances of the first coil inductor 150 and the second coil inductor 160 increase accordingly.

It is appreciated that in FIG. 2, each of the first coil inductor 150 and the second coil inductor 160 is illustrated as a round shaped inductor as an example. In other embodiments, each of the first coil inductor 150 and the second coil inductor 160 can be implemented by a square shaped inductor, a polygon shaped inductor or inductors of other shapes. Further, as described above, the number of each the first full circle 210 and the second full circle 230 is exemplarily illustrated to be 1 in FIG. 2. In other embodiments, the number of each of the first full circle 210 and the second full circle 230 can be any integer larger than 1 such that each of the first coil inductor 150 and the second coil inductor 160 includes a multiple-circle structure.

The first coil inductor 150 and the second coil inductor 160 are electrically coupled between the switched-capacitor array 120 and the antenna 110 in FIG. 1 through the first terminal N1, the second terminal N2, the third terminal N3 and the fourth terminal N4 to resonate with the switched-capacitor array 120 and transmit the differential signals DS between the switched-capacitor array 120 and the antenna 110.

In an embodiment, the first coil inductor 150 is electrically coupled to the switched-capacitor array 140A of the switched-capacitor array 120 through the first terminal N1 and is electrically coupled to the antenna 110 through the second terminal N2 and the matching network circuit 170. The second coil inductor 160 is electrically coupled a second switched-capacitor array 140B of the switched-capacitor array 120 through the fourth terminal N4 and is electrically coupled to the antenna 110 through the third terminal N3 and the matching network circuit 170. However, the present invention is not limited thereto.

Since the first full circle 210 of the first coil inductor 150 and the second full circle 230 of the second coil inductor 160 all surround the central area 250, a plurality of crossing sections has to be included by at least one of the first coil inductor 150 and the second coil inductor 160, e.g., the crossing sections 260 and 270 illustrated as dashed lines in FIG. 2, to keep the two coils from being electrically coupled to each other when the windings thereof intersect.

It is appreciated that in FIG. 2, the crossing sections 260 and 270 are exemplarily illustrated as a part of the first coil inductor 150 in FIG. 2. In other embodiments, the crossing sections 260 and 270 can be both configured to be a part of the second coil inductor 160 or can be respectively configured to be a part of one of the first coil inductor 150 and the second coil inductor 160.

In an embodiment, the first coil inductor 150 and the second coil inductor 160 are disposed at a first circuit layer (not illustrated in the figure) besides the crossing sections 260 and 270, and the crossing sections 260 and 270 are disposed at a second circuit layer (not illustrated in the figure).

In another embodiment, the first coil inductor 150 is disposed at a first circuit layer and the second coil inductor 160 is disposed at a second circuit layer. Under such a condition, the first coil inductor 150 and the second coil inductor 160 can be electrically isolated without the disposition of the crossing sections 260 and 270.

Since the differential RF power amplifier requires two inductor circuits, some approaches dispose the two inductor circuits independently that are distanced to each other. Such a configuration results in a larger area. Moreover, in order to keep the differential circuits symmetry, the two inductor circuits are mirror to each other, in which one of the inductor circuits includes the coil having a clockwise winding and the other one of the inductor circuits includes the coil having a counter clockwise winding. The mutual inductance between the two coils decreases the inductances thereof.

The RF power amplifier of the present invention allows the first coil inductor and the second coil inductor in the differential inductor circuit to share a central area. Not only the area of the two inductor circuits greatly reduces to roughly the size of a single inductor circuit, but also the inductances thereof are enhanced due to the mutual inductance of the two inductors. As a result, the objects of shrinking the area and increasing the inductance of the RF power amplifier can be accomplished at the same time.

Figure 3:
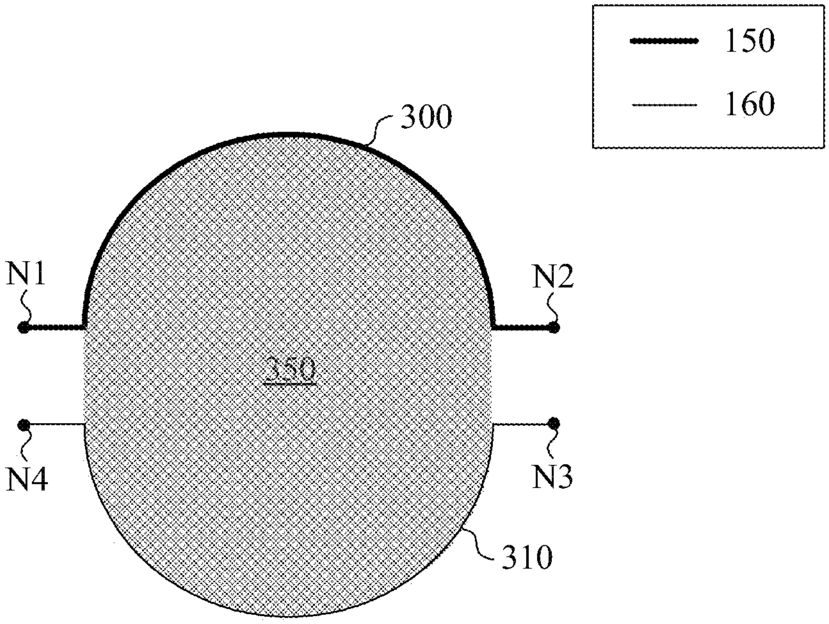
FIG. 3 illustrates a more detailed circuit diagram of the differential inductor circuit according to another embodiment of the present invention.

Reference is now made to FIG. 3. FIG. 3 illustrates a more detailed circuit diagram of the differential inductor circuit 130 according to another embodiment of the present invention.

In the present embodiment, the number of the full circle of the first coil inductor 150 that surrounds the central area 350 is 0 (N=0). As a result, the first coil inductor 150 is illustrated by a thicker line in FIG. 3, in which the first coil inductor 150 is electrically coupled to the first terminal N1, starts to extends for a first half circle 300 and is directly electrically coupled to the second terminal N2.

Similarly, the number of the full circle of the second coil inductor 160 that surrounds the central area 350 is 0 (N=0). As a result, the second coil inductor 160 is illustrated by a thinner line in FIG. 3, in which the second coil inductor 160 is electrically coupled to the third terminal N3, starts to extends for a second half circle 310 and is directly electrically coupled to the fourth terminal N4. The second half circle 310 and the first half circle 300 together enclose the central area 350.

Besides not having the full circle that surrounds the central area 350, the operation and the connection relation with the switched-capacitor array 120 and the antenna 110 in FIG. 1 of the first coil inductor 150 and the second coil inductor 160 are the same as those described in the embodiment corresponding to FIG. 2.

It is appreciated that the embodiments described above are merely an example. In other embodiments, it is appreciated that many modifications and changes may be made by those of ordinary skill in the art without departing, from the spirit of the invention.

In summary, the RF power amplifier and the differential inductor circuit thereof allow the first coil inductor and the second coil inductor in the differential inductor circuit to share a central area. Not only the area of the two inductor circuits greatly reduces to roughly the size of a single inductor circuit, but also the inductances thereof are enhanced due to the mutual inductance of the two inductors. As a result, the objects of shrinking the area and increasing the inductance of the RF power amplifier can be accomplished at the same time.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A differential inductor circuit, comprising:

a first coil inductor electrically coupled to a first terminal, starting to extend for a first half circle and further extending to surround an internal central area for N first full circles so as to be electrically coupled to a second terminal, wherein N is an integer larger than or equal to 0; and a second coil inductor electrically coupled to a third terminal, starting to extend for a second half circle and further extending to surround the internal central area for N second full circles so as to be electrically coupled to a fourth terminal, in which the second half circle and the first half circuit together enclose the central area;

wherein the first coil inductor receives a first signal of a pair of differential signals to generate a first current, and the second coil inductor receives a second signal of the pair of differential signals to generate a second current, and the first current and the second current have directions inverse to each other, in which a first induction current is generated at the second coil inductor according to the first current flowing through the first coil inductor, a second induction current is generated at the first coil inductor according to the second current flowing through the second coil inductor;

wherein the first induction current and the second current have directions inverse to each other, and the second induction current and the first current have directions inverse to each other such that inductances of the first coil inductor and the second coil inductor increase accordingly.

2. The differential inductor circuit of claim 1, wherein the first coil inductor and the second coil inductor comprise a plurality of crossing sections, and the first coil inductor and the second coil inductor are disposed at a first circuit layer besides the crossing sections and the crossing sections are disposed at a second circuit layer.

3. The differential inductor circuit of claim 1, wherein the first coil inductor is disposed at a first circuit layer and the second coil inductor is disposed at a second circuit layer.

4. The differential inductor circuit of claim 1, wherein the first coil inductor and the second coil inductor are electrically coupled between a switched-capacitor array comprised by an RF power amplifier and an antenna through the first terminal, the second terminal, the third terminal and the fourth terminal to resonate with the switched-capacitor array and transmit the pair of differential signals between the switched-capacitor array and the antenna.

5. The differential inductor circuit of claim 4, wherein the first coil inductor and the second coil inductor are electrically coupled to the antenna through a matching network circuit.

6. The differential inductor circuit of claim 1, wherein each of the first coil inductor and the second coil inductor is a round shaped inductor, a square shaped inductor or a polygon shaped inductor.

7. An RF power amplifier, comprising:

a switched-capacitor array; and a differential inductor circuit electrically coupled between the switched-capacitor array and an antenna to transmit a pair of differential signals, comprising:

a first coil inductor electrically coupled to a first terminal, starting to extend for a first half circle and further extending to surround an internal central area for N first full circles so as to be electrically coupled to a second terminal, wherein N is an integer larger than or equal to 0; and a second coil inductor electrically coupled to a third terminal, starting to extend for a second half circle and further extending to surround the internal central area for N second full circles so as to be electrically coupled to a fourth terminal, in which the second half circle and the first half circuit together enclose the central area;

wherein the first coil inductor receives a first signal of the pair of differential signals to generate a first current, and the second coil inductor receives a second signal of the pair of differential signals to generate a second current, and the first current and the second current have directions inverse to each other, in which a first induction current is generated at the second coil inductor according to the first current flowing through the first coil inductor, a second induction current is generated at the first coil inductor according to the second current flowing through the second coil inductor;

wherein the first induction current and the second current have directions inverse to each other, and the second induction current and the first current have directions inverse to each other such that inductances of the first coil inductor and the second coil inductor increase accordingly.

8. The RF power amplifier of claim 7, wherein the first coil inductor and the second coil inductor comprise a plurality of crossing sections, and the first coil inductor and the second coil inductor are disposed at a first circuit layer besides the crossing sections and the crossing sections are disposed at a second circuit layer.

9. The RF power amplifier of claim 7, wherein the first coil inductor is disposed at a first circuit layer and the second coil inductor is disposed at a second circuit layer.

10. The RF power amplifier of claim 7, wherein the first coil inductor and the second coil inductor are electrically coupled to the antenna through a matching network circuit.

11. The RF power amplifier of claim 7, wherein each of the first coil inductor and the second coil inductor is a round shaped inductor, a square shaped inductor or a polygon shaped inductor.

* * * * *